United States Patent
Palmer

(10) Patent No.: US 11,621,042 B2
(45) Date of Patent: *Apr. 4, 2023

(54) DYNAMIC DELAY OF NAND READ COMMANDS

(71) Applicant: Micron Technology, Inc., Boise, ID (US)

(72) Inventor: David Aaron Palmer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 60 days.

This patent is subject to a terminal disclaimer.

(21) Appl. No.: 17/232,725

(22) Filed: Apr. 16, 2021

(65) Prior Publication Data

US 2021/0233593 A1 Jul. 29, 2021

Related U.S. Application Data

(63) Continuation of application No. 16/894,397, filed on Jun. 5, 2020, now Pat. No. 10,991,436, which is a
(Continued)

(51) Int. Cl.
*G11C 16/26* (2006.01)
*G11C 16/32* (2006.01)
(Continued)

(52) U.S. Cl.
CPC ............ *G11C 16/26* (2013.01); *G06F 3/0611* (2013.01); *G06F 3/0659* (2013.01);
(Continued)

(58) Field of Classification Search
CPC .... G06F 3/0611; G06F 3/0659; G06F 3/0679; G06F 12/0246; G06F 13/1642; G06F 2212/1024; G11C 16/26; G11C 16/32
See application file for complete search history.

(56) References Cited

U.S. PATENT DOCUMENTS 5,471,591 A * 11/1995 Edmondson .......... G06F 9/3838
711/E12.024
6,044,206 A * 3/2000 Kohn .................. G06F 9/30087
712/E9.046
(Continued)

FOREIGN PATENT DOCUMENTS

CN 101548494 A 9/2009
CN 106155916 A 11/2016
(Continued)

OTHER PUBLICATIONS

"Chinese Application Serial No. 201911039038.9, Office Action dated Aug. 27, 2020", w/ English Translation, 12 pgs.
(Continued)

*Primary Examiner* — Henry Tsai
*Assistant Examiner* — John B Roche
(74) *Attorney, Agent, or Firm* — Schwegman Lundberg & Woessner, P.A.

(57) ABSTRACT

Disclosed in some examples are methods, systems, memory devices, and machine-readable mediums which increase read throughput by introducing a delay prior to issuing a command to increase the chances that read commands can be executed in parallel. Upon receipt of a read command, if there are no other read commands in the command queue for a given portion (e.g., plane or plane group) of the die, the controller can delay issuing the read command for a delay period using a timer. If, during the delay period, an eligible read command is received, the delayed command and the newly received command are both issued in parallel using a multi-plane read. If no eligible read command is received during the delay period, the read command is issued after the delay period expires.

20 Claims, 8 Drawing Sheets

Related U.S. Application Data continuation of application No. 16/173,557, filed on Oct. 29, 2018, now Pat. No. 10,685,718.

(51) Int. Cl.
  *G06F 3/06* (2006.01)
  *G06F 12/02* (2006.01)
  *G06F 13/16* (2006.01)

(52) U.S. Cl.
  CPC ........ *G06F 3/0679* (2013.01); *G06F 12/0246* (2013.01); *G06F 13/1642* (2013.01); *G11C 16/32* (2013.01); *G06F 2212/1024* (2013.01)

(56) References Cited

U.S. PATENT DOCUMENTS

| | | | |
|---|---|---|---|
| 9,135,192 B2 | 9/2015 | Lin et al. | |
| 10,685,718 B2* | 6/2020 | Palmer | G06F 3/0659 |
| 10,991,436 B2* | 4/2021 | Palmer | G06F 3/0659 |
| 2008/0089364 A1* | 4/2008 | Barry | H04L 47/283 |
| | | | 370/517 |
| 2013/0304998 A1* | 11/2013 | Palmer | G06F 3/0619 |
| | | | 711/E12.001 |
| 2014/0068159 A1 | 3/2014 | Yi et al. | |
| 2016/0011779 A1 | 1/2016 | Lee | |
| 2020/0135278 A1 | 4/2020 | Palmer | |
| 2020/0303019 A1 | 9/2020 | Palmer | |
| 2021/0011442 A1* | 1/2021 | Parry | H01L 22/00 |
| 2021/0064536 A1* | 3/2021 | Palmer | G06F 12/0891 |
| 2021/0233585 A1* | 7/2021 | Vigilante | G06F 11/1004 |

FOREIGN PATENT DOCUMENTS

| | | |
|---|---|---|
| CN | 107291566 A | 10/2017 |
| CN | 109947362 A | 6/2019 |
| CN | 111105828 A | 5/2020 |
| CN | 111105828 | 5/2021 |
| CN | 113035257 | 6/2021 |
| WO | WO-2016153725 A1 | 9/2016 |

OTHER PUBLICATIONS

"Chinese Application Serial No. 201911039038.9, Voluntary Amendment Filed Jul. 7, 2020", w/ English Claims, 28 pgs.

"Chinese Application Serial No. 202110441080.4, Office Action dated Sep. 17, 2021", w English translation, 12 pgs.

"Chinese Application Serial No. 201911039038.9, Response filed Jan. 8, 2021 to Office Action dated Aug. 27, 2020", w English Claims, 133 pgs.

U.S. Appl. No. 16/173,557, Non Final Office Action dated Oct. 21, 2019, 11 pgs.

U.S. Appl. No. 16/173,557, Response filed Jan. 21, 2020 to Non Final Office Action dated Oct. 21, 2019, 14 pgs.

U.S. Appl. No. 16/173,557, Notice of Allowance dated Feb. 10, 2020, 9 pgs.

U.S. Appl. No. 16/894,397, Non Final Office Action dated Sep. 3, 2020, 19 pgs.

U.S. Appl. No. 16/894,397, Response filed Dec. 3, 2020 to Non Final Office Action dated Sep. 3, 2020, 10 pgs.

U.S. Appl. No. 16/894,397, Notice of Allowance dated Dec. 31, 2020, 9 pgs.

* cited by examiner

DYNAMIC DELAY OF NAND READ COMMANDS

PRIORITY APPLICATION

This application is a continuation of U.S. application Ser. No. 16/894,397, filed Jun. 5, 2020, which is a continuation of U.S. application Ser. No. 16/173,557, filed Oct. 29, 2018, now issued as U.S. Pat. No. 10,685,718, all of which are incorporated herein by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
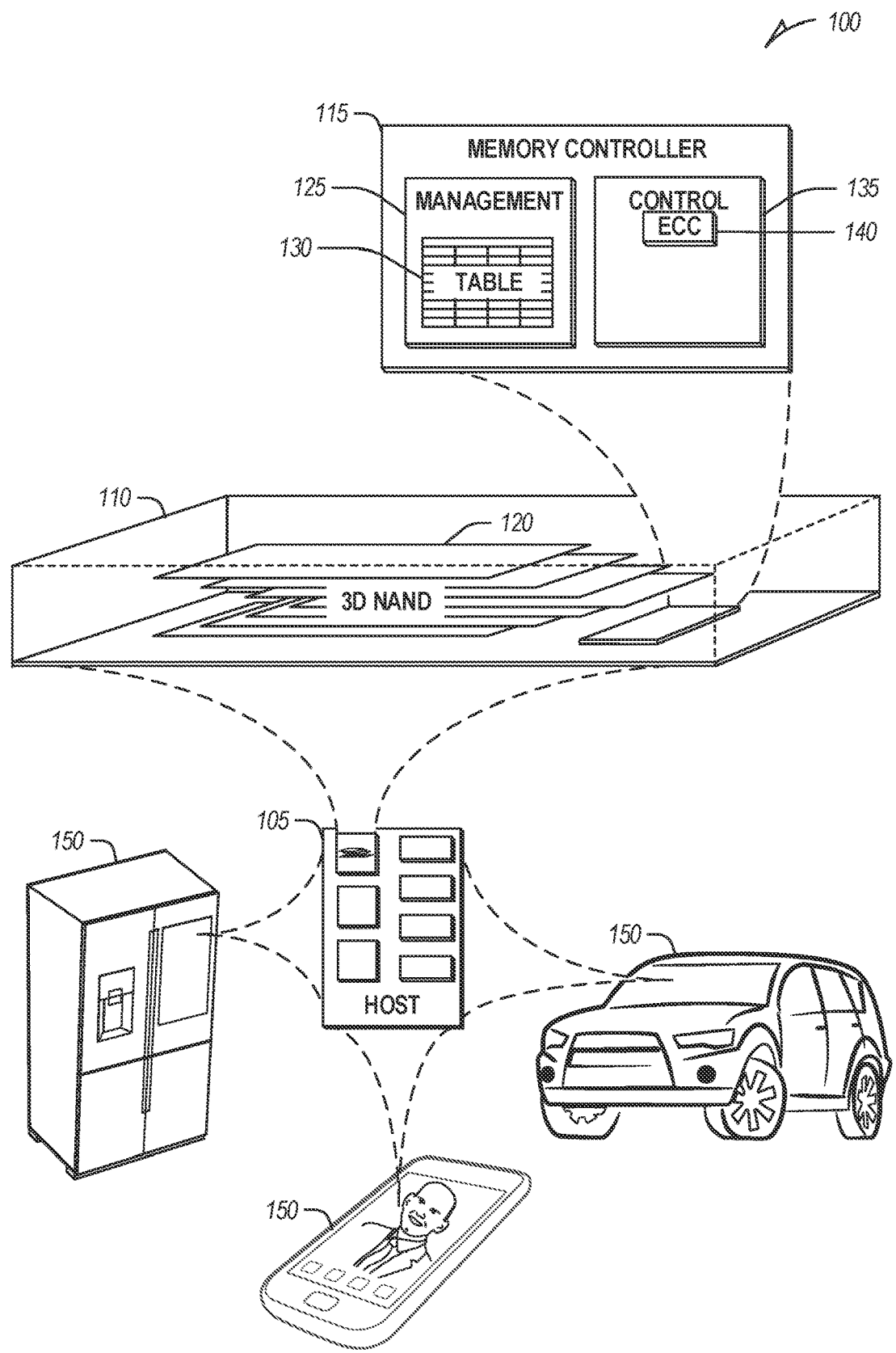
FIG. 1 illustrates an example of an environment including a memory device.

NAND memory devices can be designed such that multiple reads to different portions of a single die can be done in parallel. This may be called multiplane read. As use herein portions of the die refer generically to different planes, or different plane groups (e.g., a group of two or more planes can constitute a plane group) of a same die which may execute read commands simultaneously. Having two pending read commands for the same die but for different portions can be relatively rare for certain workloads (such as mobile phones). For example, consider managed NAND applications that have performance targets of having less than eight commands (QD8) total in a read queue at a time. A typical managed NAND memory device might have four dies with each die having two planes (for a total of eight planes). Assuming an even distribution of read commands across the NAND device, this breaks down to an average of eight commands targeting eight planes, allowing just one command per plane. Even two commands targeting a same die do not trigger multiplane reads as the first command received would be immediately issued leaving nothing in the queue. To trigger a multiplane read, both commands need to be issued to the memory array simultaneously. Thus, under the current implementation, to trigger multiplane read the memory device would need three or more commands targeting at least two portions of a same die simultaneously. This is possible and does happen but can be rare, depending on the workload. This limits the effectiveness of multiplane read under certain circumstances.

Disclosed in some examples are methods, systems, memory devices, and machine-readable mediums which increase read throughput by introducing a delay prior to issuing a read command to increase the probability that commands can be executed in parallel using multi-plane read. Upon receipt of a read command, if there are no other read commands in the read queue for a given portion (e.g., plane or plane group) of the die, the controller can delay issuing the read command for a delay period. If, during the delay period, a multiplane read eligible read command is received, the delayed command and the newly received command are both issued in parallel using a multi-plane read. If no multiplane read eligible read commands are received during the delay period, the queued read command is issued after the delay period expires. The delay period can be implemented by a software or hardware timer. In some examples, the length of the delay period can be dynamic and can adjust based upon the host workload to maximize the benefits of multiplane read and minimize the penalty to overall command latency and throughput. While the disclosed methods increase read command latency of a single command by a small amount, the overall system latency can be reduced by executing more read commands in parallel.

System Overview

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die, one or more NAND dies, or the like). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 800 of FIG. 8.

The memory controller 115 can be on one or more separate integrated circuits from the memory array 120 or can be on a same integrated circuit. In some examples, the functions of memory controller 115 can be divided across multiple integrated circuits. For example, some functionality can be on a separate integrated circuit and some functionality can be part of a controller on each memory die of the memory array 120. Memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array can comprise a number of NAND dies and one or more functions of the memory controller 115 for a particular NAND die can be implemented on an on-die controller on that particular die. Other organizations and delineations of control functionality can also be utilized, such as a controller for each die, plane, superblock, block, page, and the like.

The memory array 120 can include several memory cells arranged in, for example, a number of devices, semiconductor dies, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
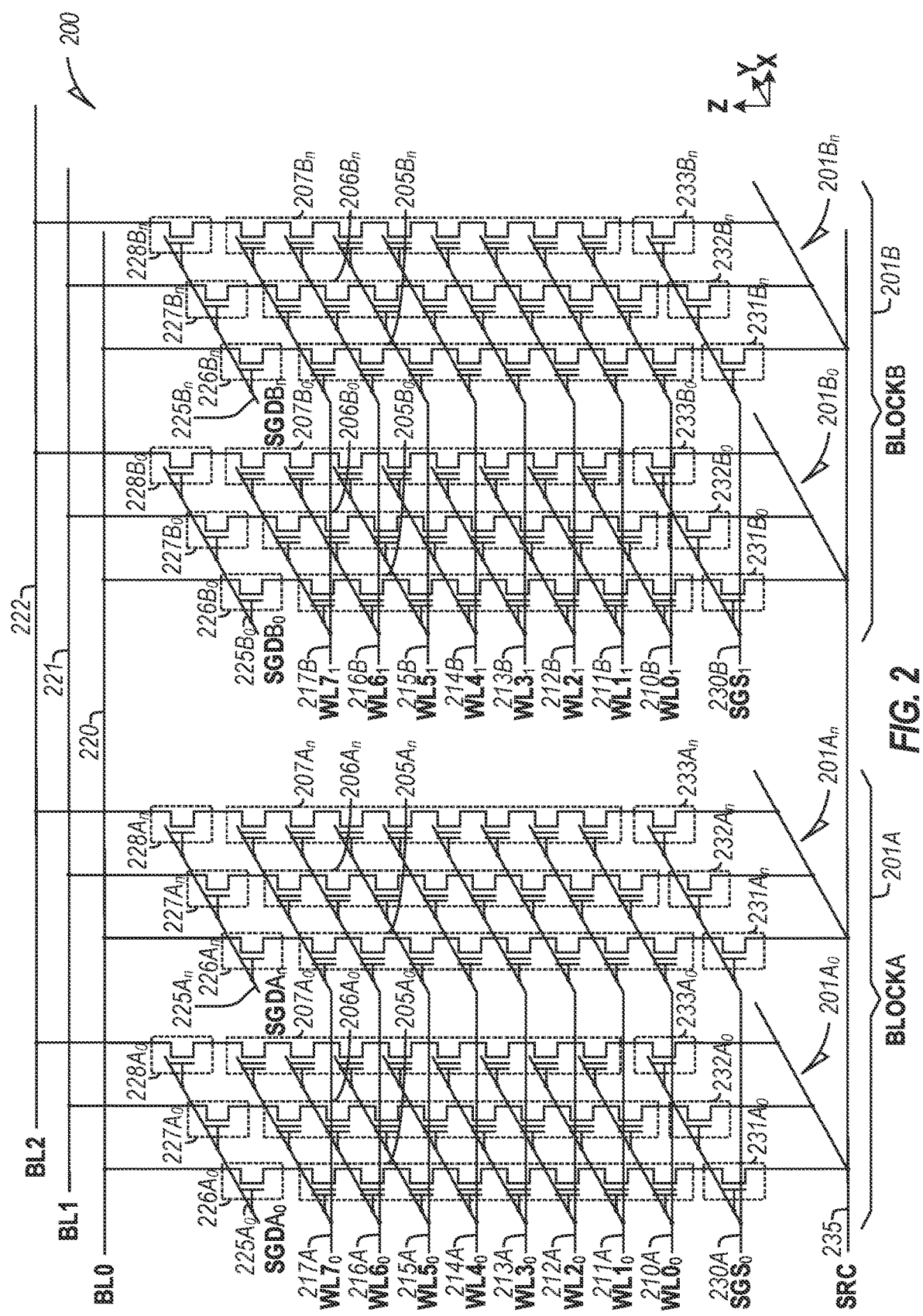
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
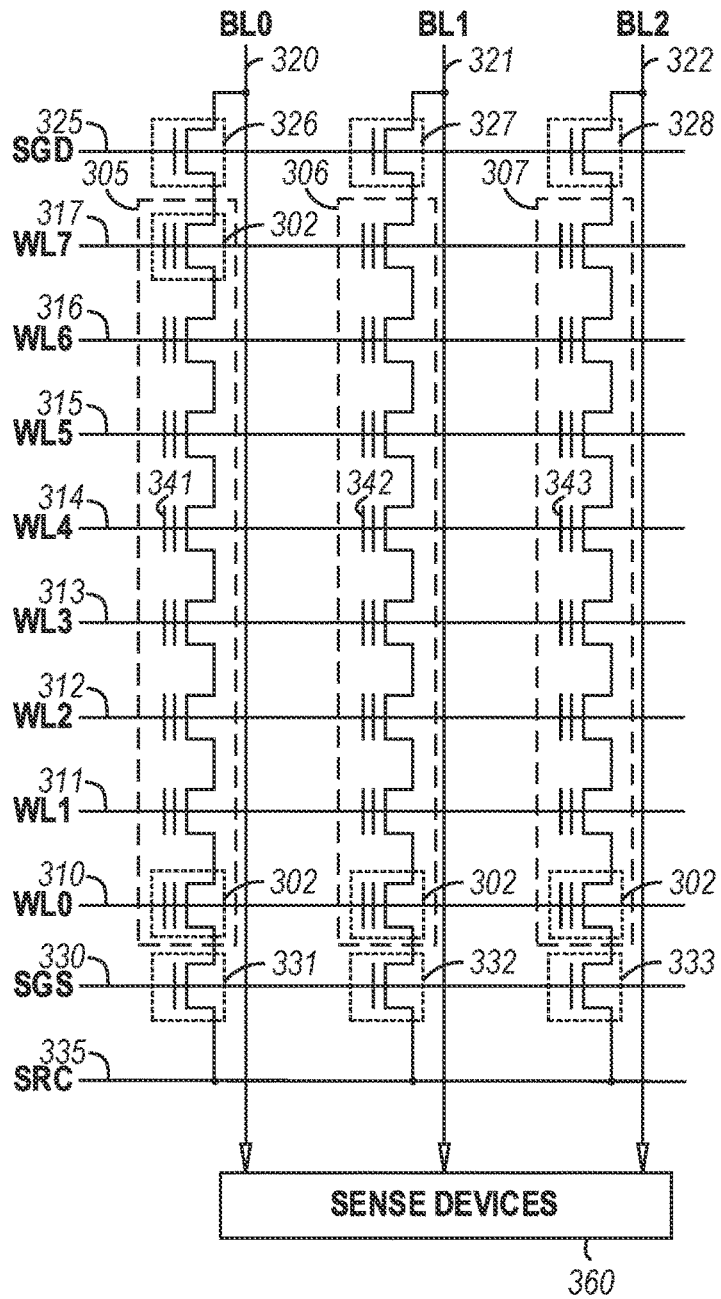

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
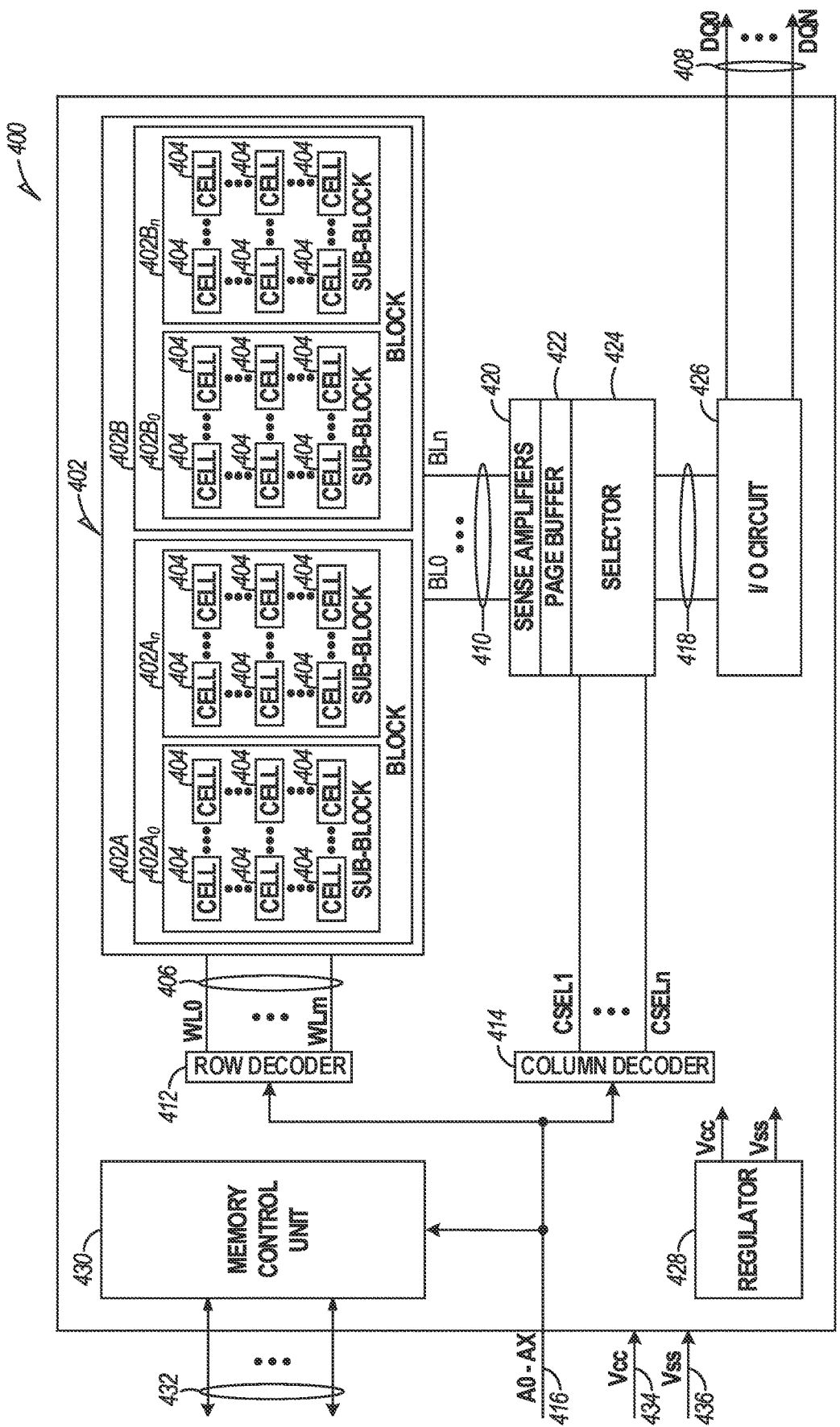
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks $402A_0$, $402A_n$, and the second block 402B can include first and second sub-blocks $402B_0$, $402B_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402 or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418. In some examples a flash translation layer (not shown) can map addresses provided by a host to physical memory addresses used by the row decoder 412 and column decoder 414 to read data in the memory array 402.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Dynamic Delay of Memory Commands

Normally, when the memory device receives a host read command and if the read queue is empty for that particular die, the memory device issues the read command immediately for execution. If the read queue has another command in it or the memory device is presently executing another command, the memory device adds the command to the end of the read queue. Once the memory device is ready for the next read command, the first command in the queue is read from the queue (e.g., in a first-in-first-out (FIFO) order) and issued to the memory device. The queue is a die-level queue—that is read commands for the die are queued into a same queue regardless of which portion of the die they are for.

As previously described, the NAND can be designed to allow for parallel execution of read commands for a particular portion of a NAND die. To maximize the probability that multiple read commands are executed in parallel, an intentional delay can be introduced into the read command processing.

Figure 5:
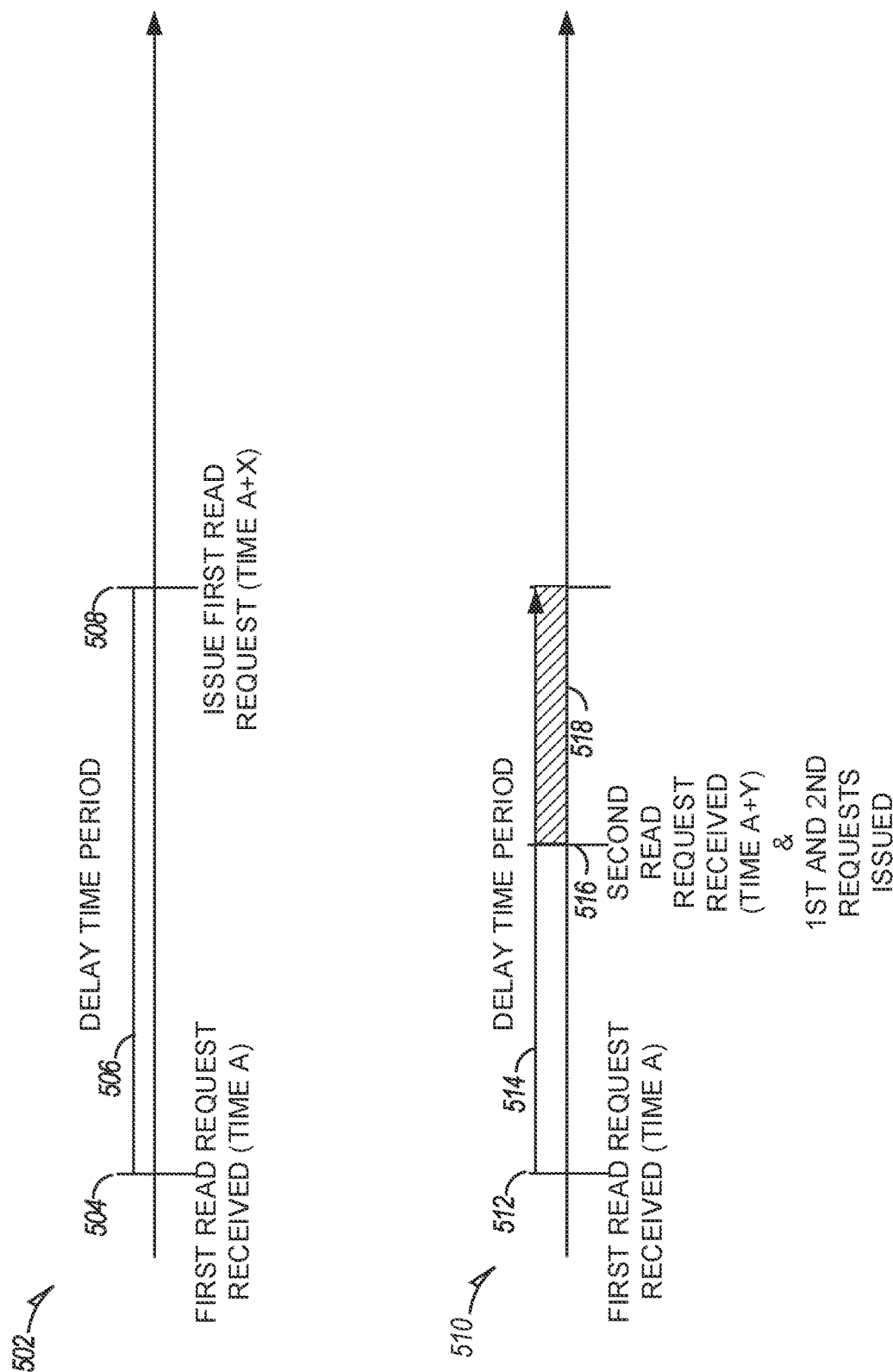
FIG. 5 shows two timelines of a read command implementing the delayed read command of the present disclosure according to some examples of the present disclosure.

FIG. 5 shows two timelines of a read command implementing the delayed read command of the present disclosure according to some examples of the present disclosure. Timeline 502 shows a timeline where a first read request for a first portion (e.g., a first plane or plane group) of a first die is received at time A 504. At time A, no other multiplane read compatible read commands are waiting in a queue for the first die. Multiplane read compatible read commands are two read commands targeting two different portions of a same memory (e.g., NAND) die. Rather than immediately issue the first read request, the memory controller delays issuing the read command to the memory array until the earliest of the expiry of the delay time period or the receipt of a multiplane read compatible read command (e.g., a second read request to a second portion of the first die). As shown in timeline 502, no other read requests are received for a second portion of the first die during the delay period 506. At the end of the delay period 506, the first read request can be issued 508, at time A+X—where X is the length of the delay period.

In contrast, for timeline 510, a first read request for a first portion of a first die can be received at time A 512. At time A, no other multiplane read compatible read commands are waiting in a queue for the first die. Rather than immediately issue the first read request, the memory controller delays issuing the read command to the memory array until the earliest of the expiry of the delay time period 514 or the receipt of a second read request to a second portion of the first die. As shown on timeline 510, a second read request is received at time A+y which is prior to the expiry of the delay time period. The second read request is multiplane read compatible as it targets a second area of the first die. At 516, the first and second read requests are executed as multiplane read requests and executed in parallel. The remaining part of the delay time period 518 can then be canceled.

The delay time period can be implemented by a timer that can be a software or hardware-based timer. For example, upon receiving the first read request at 504 or 512 the controller can set a timer with a time out value of X. If the timer expires (as shown in timeline 502), the pending read command (first read request 504) can be issued. If, prior to expiration of the timer, a second read request is received (as shown in timeline 510), the first and second read requests can be executed in parallel and the timer can be canceled.

Figure 6:
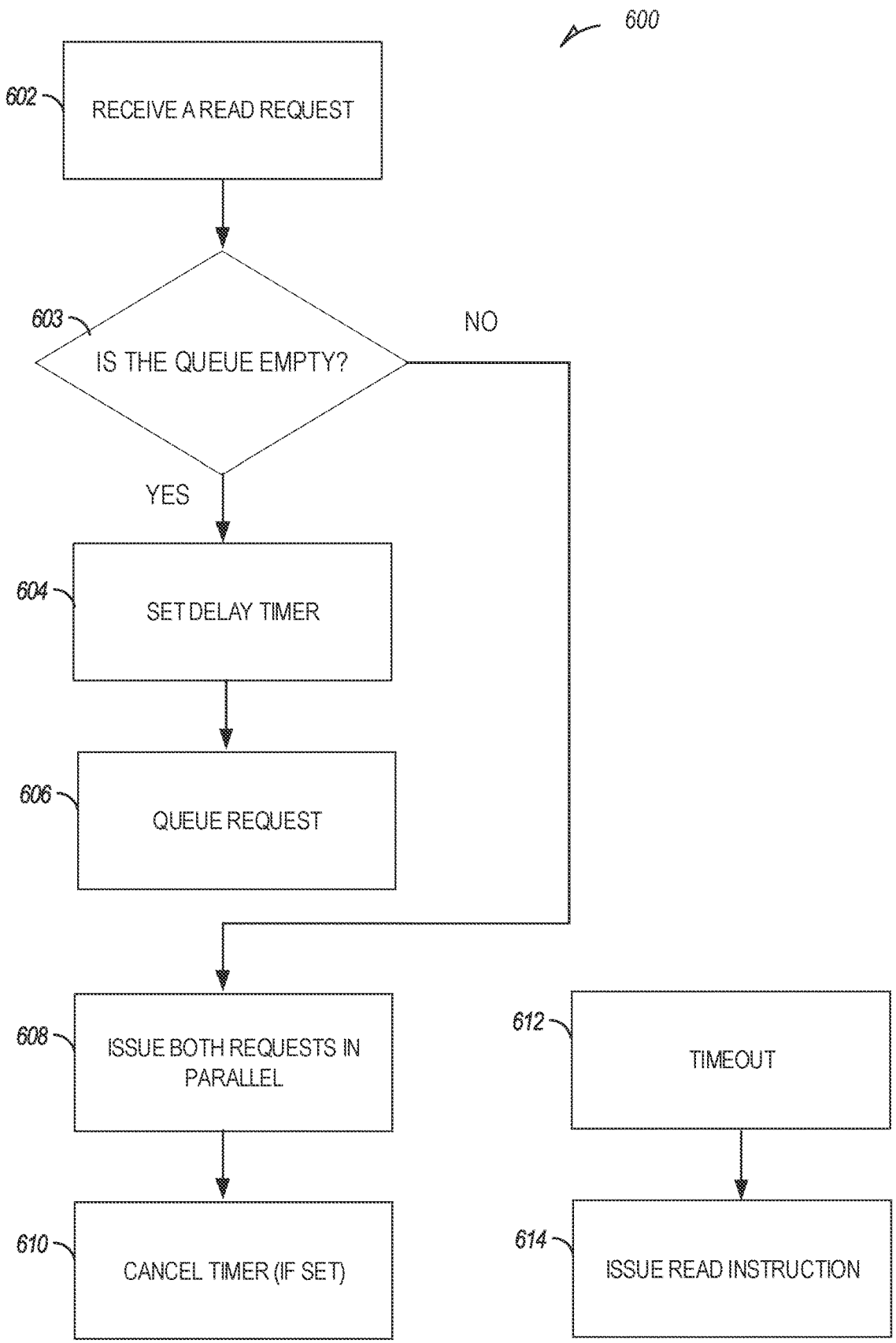
FIG. 6 shows a flowchart of a method of increasing a probability of parallel execution of read commands according to some examples of the present disclosure.

FIG. 6 shows a flowchart of a method 600 of increasing a probability of parallel execution of read commands according to some examples of the present disclosure. At operation 602 a read request is received for a first portion of a first die (e.g., a first plane or a first group of planes). At operation 603, the controller checks to see if the queue is empty for that die or whether a multiplane read compatible read request is pending in the queue (e.g., a delay period is pending). To determine if a multiplane read compatible request is pending, the read requests in the queue may be scanned. If the queue is empty, a delay period timer can be started at operation 604 and the request queued at operation 606. If the queue is not empty and a compatible multiplane read request is pending, then at operation 608, both the request received at operation 602 and the queued request can be issued as a multiplane read command for execution in parallel. If the queue is not empty, but the command(s) in the queue are not compatible multiple plane read requests, then in some examples, no timer is started. In other examples, if the queue is not empty, but the command(s) in the queue are not compatible multiple plane read requests, then in some examples the timer is still started as if the queue was empty. At operation 610, if a previous delay period timer was set, then that can be canceled. If the delay timer set at operation 604 expires prior to receipt of a second multiplane read eligible command, then at operation 612 the timeout can be received. For example, a timeout message or notification is received or recognized such that code in the controller executes to handle the timeout. At operation 614, pending read instructions that were enqueued, e.g., at operation 606 can be issued and the queue can be emptied.

Figure 7:
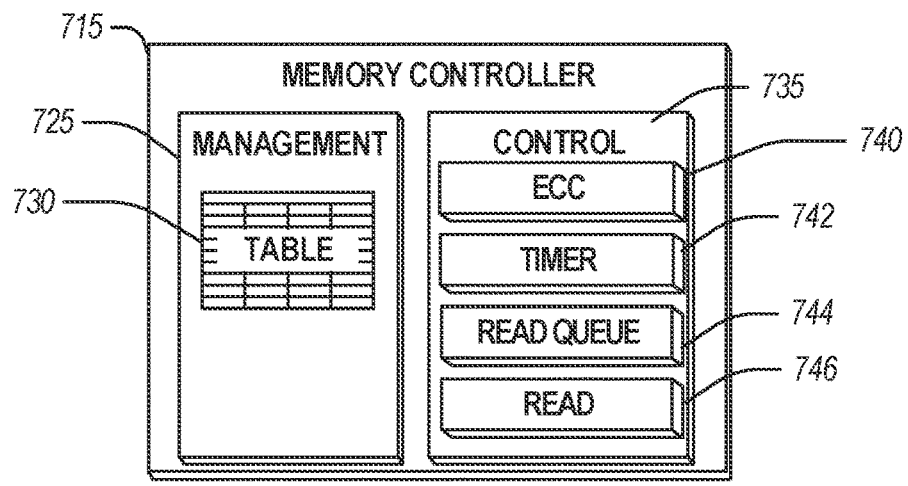
FIG. 7 shows an example logical diagram of a functionality of a memory controller according to some examples of the present disclosure.

FIG. 7 shows an example logical diagram of a functionality of a memory controller 715 according to some examples of the present disclosure. For example, memory controller 715 can be an example implementation of memory controller 115. The memory controller 715 can include a memory manager 725 and an array controller 735. Memory manager 725 can be an example of memory manager 125 and array controller 735 can be an example of array controller 135.

The memory manager 725 can include a set of management tables 730 configured to maintain various information associated with one or more component of the memory device. Management tables 730 can be an example of management table 130. As noted with respect to management table 130, the management tables 730 can include information regarding block age, block erase count, error history, or one or more error counts (e.g., a write operation error count, a read bit error count, a read operation error count, an erase error count, etc.) for one or more blocks of memory cells coupled to the memory controller 715. Management tables 730 can store of one or more components of a write amplification metric.

The array controller 735 can include, among other things, circuitry or components configured to control memory operations associated with writing data to, reading data from, or erasing one or more memory cells of the memory device coupled to the memory controller 715. Array controller 735 can be an example of array controller 135. The memory operations can be based on, for example, host commands received from the host 105, or internally generated by the memory manager 725 (e.g., in association with wear leveling, error detection or correction, etc.). The array controller 735 can include an error correction code (ECC) component 740, which can be an example of error correction code (ECC) component 140.

Read component 746 can handle read requests by hosts. For example, read component 746 can implement the method of FIG. 6. Read component 746 can check a queue for the particular die for multiplane read compatible read commands in the queue. If a multiplane read compatible read command is present in the queue, then the read component 746 can issue the read commands together as part of a multiplane read command that causes the reads to be executed in parallel. As noted previously, a different portion can be a different plane, but in other examples a different portion can be a different plane group (e.g., multiple planes can be grouped together logically into a plane group), a different page, block, or the like. If the queue does not contain any compatible multiplane read commands, the read component 746 can place the read request into the queue and start a timer to start the delay time period. As previously discussed, the read request is issued to the memory array upon the earlier of a compatible multiplane read request being received and the expiry of the timer.

Timer component 742 can determine the value of the delay time period based upon statistics calculated about memory device workload. Each die, plane, or other portion of the memory can have a same or different timeout value and thus a same or different delay time period. Example statistics include queue depths (e.g., the higher the queue depth the shorter the delay time period and vice versa), a read volume, multiplane read utilization percentages, statistics tracked that indicate a probability that a multiplane read compatible read will be received for a given duration, or the like. The delay time period length can be determined each time the timer is set (e.g., the calculations or lookups can be done each time the timer is set), or can be determined periodically by the memory device (e.g., an independent process monitors statistics on which the timeout value is based and stores the timeout value which is then retrieved when the timer is set).

In some examples, the delay time period length can be determined based upon the instantaneous queue depth. For example, when the timer is set, a queue depth can be determined, and a lookup table can return a predetermined timer value for that queue depth. In other examples, a running average queue depth over a period of time is used to determine the delay time period. For example, the average queue depth for the past 5 minutes can be used along with a lookup table that can return a predetermined timer value for that queue depth. In some examples, instead of a lookup table, a function or formula can be used to determine the delay time period length with a queue depth or average queue depth as inputs to the function. For example, a step function, a linear function, or the like.

In other examples, other statistics can be used to set the delay time period length, such as a multiplane read utilization percentage that tracks the percentage of read requests that are submitted as multiplane read requests. This statistic can be tracked by the read component 746 and used by timer component 742 to set the timeout length. The utilization percentage is defined as the number of multiplane read requests divided by the total number of read requests multiplied by 100. The memory device can compare the multiplane read utilization percentage to a target multiplane read utilization percentage. A multiplane read utilization percentage below the target can cause an increase in the delay time period (up to a maximum value). The multiplane read utilization percentage can cause successive increases in the delay time period until the multiplane read utilization percentage is either at or greater than the target multiplane read utilization or until a maximum delay time period length is reached. In some examples, in order to ensure minimal delay, once the multiplane read utilization percentage is either at or greater than the target multiplane read utilization the time value can decay back to a minimum value so long as the multiplane read utilization remains at the utilization percentage. As previously described, the delay period length can be bounded by a determined maximum time period value chosen to ensure that the system does not delay read requests for too long.

Read queue component 744 can implement the read command queues. Read commands received from the host can be initially received by the read component 746. Read component 746 can submit received read requests to read queue component for enqueuing and can receive read requests that are dequeued. Read queue 744 can include logic for determining a queue depth to enable the read component 746 to decide whether to enqueue the read request or issue it immediately.

Figure 8:
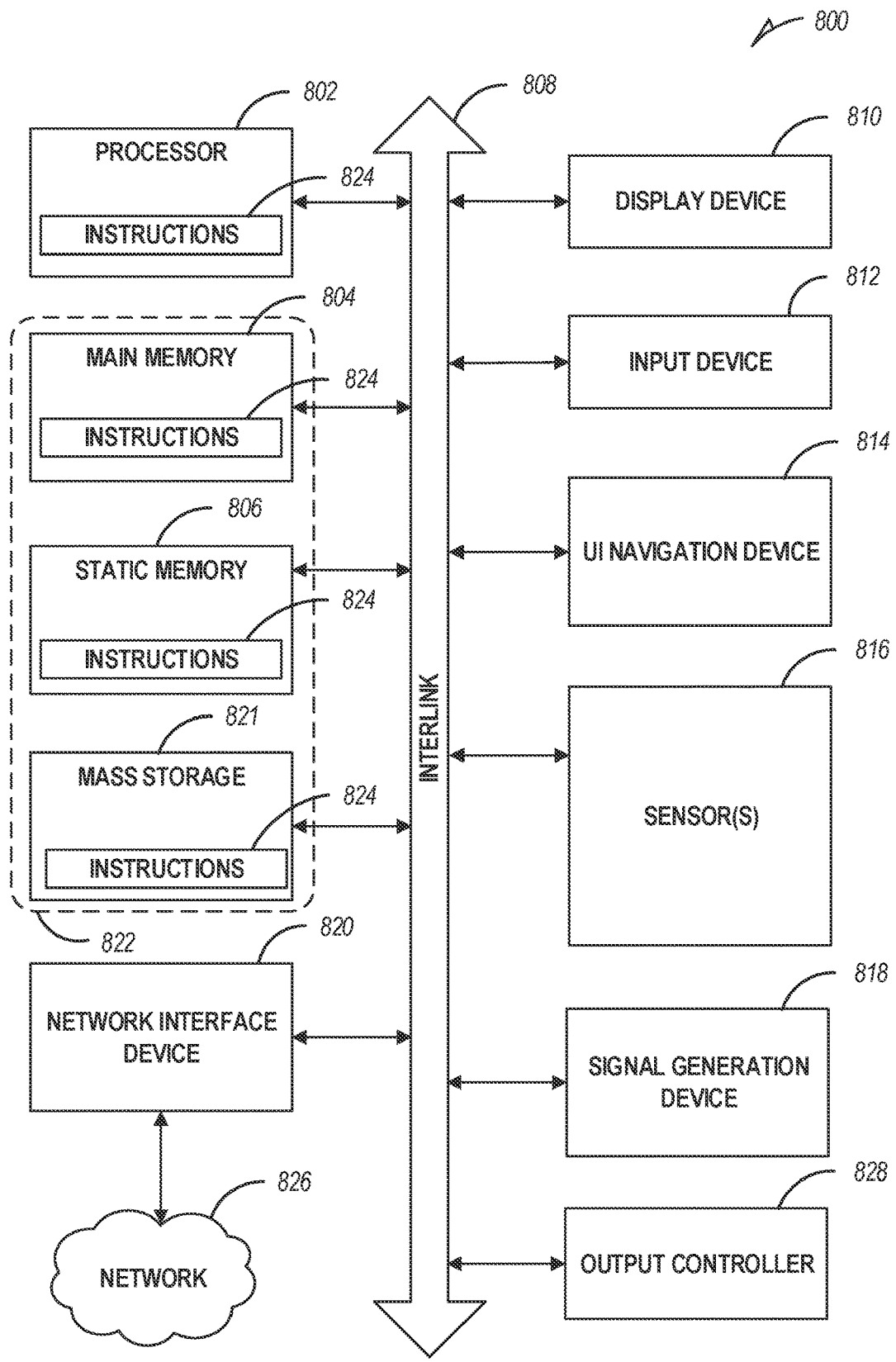
FIG. 8 is a block diagram illustrating an example of a machine upon which one or more embodiments can be implemented.

FIG. 8 illustrates a block diagram of an example machine 800 upon which any one or more of the techniques (e.g., methodologies) discussed herein can perform. In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a personal computer (PC), a tablet PC, a set-top box (STB), a personal digital assistant (PDA), a mobile telephone, a web appliance, an IoT device, automotive system, a host device, or any machine capable of executing instructions (sequential or otherwise) that specify actions to be taken by that machine. Components of machine 1000 can be present in a memory device (e.g., a processor, main memory, mass storage and the like). Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 800 (e.g., the host device 105, the memory device 110, etc.) can include a hardware processor 802 (e.g., a central processing unit (CPU), a graphics processing unit (GPU), a hardware processor core, or any combination thereof, such as the memory controller 115, etc.), a main memory 804 and a static memory 806, some or all of which can communicate with each other via an interlink (e.g., bus) 808. The machine 800 can further include a display unit 810, an alphanumeric input device 812 (e.g., a keyboard), and a user interface (UI) navigation device 814 (e.g., a mouse). In an example, the display unit 810, input device 812 and UI navigation device 814 can be a touch screen display. The machine 800 can additionally include a storage device (e.g., drive unit) 821, a signal generation device 818 (e.g., a speaker), a network interface device 820, and one or more sensors 816, such as a global positioning system (GPS) sensor, compass, accelerometer, or other sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine readable medium 822 can include storage device 821 on which one or more sets of data structures or instructions 824 (e.g., software) embodying or utilized by any one or more of the techniques or functions described herein. The instructions 824 can also reside, completely or at least partially, within the main memory 804, within static memory 806, or within the hardware processor 802 during execution thereof by the machine 800. In an example, one or any combination of the hardware processor 802, the main memory 804, the static memory 806, or the storage device 821 can constitute the machine readable medium 822.

While the machine readable medium 822 is illustrated as a single medium, the term "machine readable medium" can include a single medium or multiple media (e.g., a centralized or distributed database, or associated caches and servers) configured to store the one or more instructions 824.

The term "machine readable medium" can include any medium capable of storing, encoding, or carrying instructions for execution by the machine 800 and that cause the machine 800 to perform any one or more of the techniques of the present disclosure, or capable of storing, encoding or carrying data structures used by or associated with such instructions. Non-limiting machine readable medium examples can include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 (e.g., software, programs, an operating system (OS), etc.) or other data are stored on the storage device 821, can be accessed by the memory 804 for use by the processor 802. The memory 804 (e.g., DRAM) is typically fast, but volatile, and thus a different type of storage than the storage device 821 (e.g., an SSD), which is suitable for long-term storage, including while in an "off" condition. The instructions 824 or data in use by a user or the machine 800 are typically loaded in the memory 804 for use by the processor 802. When the memory 804 is full, virtual space from the storage device 821 can be allocated to supplement the memory 804; however, because the storage 821 device is typically slower than the memory 804, and write speeds are typically at least twice as slow as read speeds, use of virtual memory can greatly reduce user experience due to storage device latency (in contrast to the memory 804, e.g., DRAM). Further, use of the storage device 821 for virtual memory can greatly reduce the usable lifespan of the storage device 821.

In contrast to virtual memory, virtual memory compression (e.g., the Linux® kernel feature "ZRAM") uses part of the memory as compressed block storage to avoid paging to the storage device 821. Paging takes place in the compressed block until it is necessary to write such data to the storage device 821. Virtual memory compression increases the usable size of memory 804, while reducing wear on the storage device 821.

Storage devices optimized for mobile electronic devices, or mobile storage, traditionally include MMC solid-state storage devices (e.g., micro Secure Digital (Micros™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 824 can further be transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 can include one or more physical jacks (e.g., Ethernet, coaxial, or phone jacks) or one or more antennas to connect to the communications network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 800, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure can be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but can instead be generally perpendicular to the surface of the substrate, and can form an acute angle with the surface of the substrate (e.g., between 60 and 120 degrees, etc.).

In some embodiments described herein, different doping configurations can be applied to a source-side select gate (SGS), a control gate (CG), and a drain-side select gate (SGD), each of which, in this example, can be formed of or at least include polysilicon, with the result such that these tiers (e.g., polysilicon, etc.) can have different etch rates when exposed to an etching solution. For example, in a process of forming a monolithic pillar in a 3D semiconductor device, the SGS and the CG can form recesses, while the SGD can remain less recessed or even not recessed. These doping configurations can thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

OTHER NOTES AND EXAMPLES

Example 1 is a method for increasing a probability of a parallel read within a memory die of a memory device, the method comprising: at a controller of the memory device, performing operations comprising: receiving a first host read command requesting data stored on a first portion of a die of the memory device; determining that a host read command queue is empty; responsive to determining that the host read command queue is empty, delaying execution of the first host read command for a delay time period; receiving, during the delay time period, a second host read command requesting data stored on a second portion of the die of the memory device; and causing execution of the first host read command and the second host read command in parallel.

In Example 2, the subject matter of Example 1 includes, wherein the delay time period is variable and is determined based upon a depth of the host read command queue.

In Example 3, the subject matter of Example 2 includes, increasing the delay time period responsive to a decrease in the host read command queue.

In Example 4, the subject matter of Examples 1-3 includes, wherein the method further comprises: receiving a third host read command requesting data stored on the first portion of the die of the memory device; determining that the host read command queue is empty; responsive to determining that the host read command queue is empty, delaying execution of the third host read command for the delay time period; determining that the delay time period has lapsed without receipt of a fourth host read command requesting data stored on a second portion of the die of the memory device, and in response, causing execution of the third host read command.

In Example 5, the subject matter of Examples 1-4 includes, wherein causing execution of the host read command and the second host read command comprises combining the commands.

In Example 6, the subject matter of Examples 1-5 includes, wherein causing execution of the host read command and the second host read command comprises canceling the delay time period.

In Example 7, the subject matter of Examples 1-6 includes, wherein the memory device is a NAND memory device.

In Example 8, the subject matter of Examples 1-7 includes, wherein the method further comprises: receiving a third host read command requesting data stored on the first portion of the die of the memory device; determining that the host read command queue is not empty; and responsive to determining that the host read command queue is not empty, causing execution of the third host read command without a delay period.

Example 9 is a memory device comprising: a NAND die, the die comprising a plurality of different portions; a controller configured to performing operations comprising: receiving a first host read command requesting data stored on a first portion of the plurality of different portions of the die of the memory device; determining that a host read command queue is empty; responsive to determining that the host read command queue is empty, delaying execution of the first host read command for a delay time period; receiving, during the delay time period, a second host read command requesting data stored on a second portion of the die of the memory device; and causing execution of the first host read command and the second host read command in parallel.

In Example 10, the subject matter of Example 9 includes, wherein the delay time period is variable and wherein the operations comprise determining a delay time period value based upon a depth of the host read command queue.

In Example 11, the subject matter of Example 10 includes, wherein the operations further comprise: increasing the delay time period responsive to a decrease in the host read command queue.

In Example 12, the subject matter of Examples 9-11 includes, wherein the operations further comprise: receiving a third host read command requesting data stored on the first portion of the die of the memory device; determining that the host read command queue is empty; responsive to determining that the host read command queue is empty, delaying execution of the third host read command for the delay time period; determining that the delay time period has lapsed without receipt of a fourth host read command requesting data stored on a second portion of the die of the memory device, and in response, causing execution of the third host read command.

In Example 13, the subject matter of Examples 9-12 includes, wherein the operations of causing execution of the host read command and the second host read command comprises combining the commands.

In Example 14, the subject matter of Examples 9-13 includes, wherein the operations of causing execution of the host read command and the second host read command comprises canceling the delay time period.

In Example 15, the subject matter of Examples 9-14 includes, wherein the operations further comprise: receiving a third host read command requesting data stored on the first portion of the die of the memory device; determining that the host read command queue is not empty; and responsive to determining that the host read command queue is not empty, causing execution of the third host read command without a delay period.

Example 16 is a machine-readable medium storing instructions, which when executed by a controller, cause the controller to perform operations comprising: receiving a first host read command requesting data stored on a first portion of a die of a memory device; determining that a host read command queue is empty; responsive to determining that the host read command queue is empty, delaying execution of the first host read command for a delay time period; receiving, during the delay time period, a second host read command requesting data stored on a second portion of the die of the memory device; and causing execution of the first host read command and the second host read command in parallel.

In Example 17, the subject matter of Example 16 includes, wherein the delay time period is variable and wherein the operations comprise determining a delay time period value based upon a depth of the host read command queue.

In Example 18, the subject matter of Example 17 includes, wherein the operations further comprise: increasing the delay time period responsive to a decrease in the host read command queue.

In Example 19, the subject matter of Examples 16-18 includes, wherein the operations further comprise: receiving a third host read command requesting data stored on the first portion of the die of the memory device; determining that the host read command queue is empty; responsive to determining that the host read command queue is empty, delaying execution of the third host read command for the delay time period; determining that the delay time period has lapsed without receipt of a fourth host read command requesting data stored on a second portion of the die of the memory device, and in response, causing execution of the third host read command.

In Example 20, the subject matter of Examples 16-19 includes, wherein the operations of causing execution of the host read command and the second host read command comprises combining the commands.

In Example 21, the subject matter of Examples 16-20 includes, wherein the operations of causing execution of the host read command and the second host read command comprises canceling the delay time period.

In Example 22, the subject matter of Examples 16-21 includes, wherein the operations further comprise: receiving a third host read command requesting data stored on the first portion of the die of the memory device; determining that the host read command queue is not empty; and responsive to determining that the host read command queue is not empty, causing execution of the third host read command without a delay period.

Example 23 is a memory device comprising: means for receiving a first host read command requesting data stored on a first portion of a die of the memory device; means for determining that a host read command queue is empty; means for responsive to determining that the host read command queue is empty, delaying execution of the first host read command for a delay time period; means for receiving, during the delay time period, a second host read command requesting data stored on a second portion of the die of the memory device; and means for causing execution of the first host read command and the second host read command in parallel.

In Example 24, the subject matter of Example 23 includes, wherein the delay time period is variable and is determined based upon a depth of the host read command queue.

In Example 25, the subject matter of Example 24 includes, means for increasing the delay time period responsive to a decrease in the host read command queue.

In Example 26, the subject matter of Examples 23-25 includes, wherein the memory device further comprises: means for receiving a third host read command requesting data stored on the first portion of the die of the memory device; means for determining that the host read command queue is empty; means for responsive to determining that the host read command queue is empty, delaying execution of the third host read command for the delay time period; means for determining that the delay time period has lapsed without receipt of a fourth host read command requesting data stored on a second portion of the die of the memory device, and in response, causing execution of the third host read command.

In Example 27, the subject matter of Examples 23-26 includes, wherein causing execution of the host read command and the second host read command comprises combining the commands.

In Example 28, the subject matter of Examples 23-27 includes, wherein causing execution of the host read command and the second host read command comprises canceling the delay time period.

In Example 29, the subject matter of Examples 23-28 includes, wherein the memory device is a NAND memory device.

In Example 30, the subject matter of Examples 23-29 includes, wherein the memory device further comprises: means for receiving a third host read command requesting data stored on the first portion of the die of the memory device; means for determining that the host read command queue is not empty; and means for responsive to determining that the host read command queue is not empty, causing execution of the third host read command without a delay period.

Example 31 is at least one machine-readable medium including instructions that, when executed by processing circuitry, cause the processing circuitry to perform operations to implement of any of Examples 1-30.

Example 32 is an apparatus comprising means to implement of any of Examples 1-30.

Example 33 is a system to implement of any of Examples 1-30.

Example 34 is a method to implement of any of Examples 1-30.

The invention claimed is:

1. A method for reading non-volatile memory of a memory device, the method comprising:
    using a processor of the memory device, performing operations comprising:
    receiving a first read command for a first portion of a die of the memory device;
    determining whether a multiplane read compatible read request is queued in a command queue of the memory device;
    responsive to a determination that the command queue does not contain the multiplane read compatible read request, queueing the first read command and starting a timer;
    receiving, prior to expiry of the timer, a second read command, the second read command being a multiplane read compatible read request for a second portion of the die of the memory device; and
    responsive to receiving the second read command, causing execution of the first read command and the second read command in parallel.

2. The method of claim 1, wherein a timeout value of the timer is set according to a depth of the command queue when the timer is set.

3. The method of claim 1, wherein determining whether the multiplane read compatible read request is queued in the command queue of the memory device comprises determining whether another read request is queued in the command queue that is for a second portion of the die of the memory device.

4. The method of claim 3, wherein the first portion is a first plane and the second portion is a second plane of the die.

5. The method of claim 1, wherein the method further comprises:
    subsequent to causing execution of the first read command and the second read command in parallel:
    receiving a third read command for a first portion of a die of the memory device;
    determining whether a multiplane read compatible read request is queued in a command queue of the memory device;
    responsive to a determination that the command queue does not contain the multiplane read compatible read request, queueing the third read command and restarting the timer;
    determining that the timer expires prior to receiving another multiplane read compatible read request; and
    responsive to determining that the timer expires prior to receiving another multiplane read compatible read request, causing execution of the third read command.

6. The method of claim 1, wherein causing execution of the first read command and the second read command comprises combining the first read command and the second read command and sending the combined command to the memory die.

7. The method of claim 1, wherein the method further comprises:
    receiving a third read command for a first portion of a die of the memory device;
    determining whether a multiplane read compatible read request is queued in a command queue of the memory device; and
    responsive to a determination that the command queue contains a fourth read command that is a multiplane read compatible read request, executing the third read command and the fourth read command in parallel.

8. A memory device comprising:
    a controller configured to perform operations comprising:
    receiving a first read command for a first portion of a die of the memory device;
    determining whether a multiplane read compatible read request is queued in a command queue of the memory device;
    responsive to a determination that the command queue does not contain the multiplane read compatible read request, queueing the first read command and starting a timer;
    receiving, prior to expiry of the timer, a second read command, the second read command being a multiplane read compatible read request for a second portion of the die of the memory device; and
    responsive to receiving the second read command, causing execution of the first read command and the second read command in parallel.

9. The memory device of claim 8, wherein a timeout value of the timer is set according to a depth of the command queue when the timer is set.

10. The memory device of claim 8, wherein the operations of determining whether the multiplane read compatible read request is queued in the command queue of the memory device comprise determining whether another read request is queued in the command queue that is for a second portion of the die of the memory device.

11. The memory device of claim 10, wherein the first portion is a first plane and the second portion is a second plane of the die.

12. The memory device of claim 8, wherein the operations further comprise:
subsequent to causing execution of the first read command and the second read command in parallel:
receiving a third read command for a first portion of a die of the memory device;
determining whether a multiplane read compatible read request is queued in a command queue of the memory device;
responsive to a determination that the command queue does not contain the multiplane read compatible read request, queueing the third read command and restarting the timer;
determining that the timer expires prior to receiving another multiplane read compatible read request; and
responsive to determining that the timer expires prior to receiving another multiplane read compatible read request, causing execution of the third read command.

13. The memory device of claim 8, wherein the operations of causing execution of the first read command and the second read command comprise combining the first read command and the second read command and sending the combined command to the memory die.

14. The memory device of claim 8, wherein the operations further comprise:
receiving a third read command for a first portion of a die of the memory device;
determining whether a multiplane read compatible read request is queued in a command queue of the memory device; and
responsive to a determination that the command queue contains a fourth read command that is a multiplane read compatible read request, executing the third read command and the fourth read command in parallel.

15. A non-transitory machine-readable medium, storing instructions, that when executed by a memory device, cause the memory device to perform operations comprising:
receiving a first read command for a first portion of a die of the memory device;
determining whether a multiplane read compatible read request is queued in a command queue of the memory device;
responsive to a determination that the command queue does not contain the multiplane read compatible read request, queueing the first read command and starting a timer;
receiving, prior to expiry of the timer, a second read command, the second read command being a multiplane read compatible read request for a second portion of the die of the memory device; and
responsive to receiving the second read command, causing execution of the first read command and the second read command in parallel.

16. The non-transitory machine-readable medium of claim 15, wherein a timeout value of the timer is set according to a depth of the command queue when the timer is set.

17. The non-transitory machine-readable medium of claim 15, wherein the operations of determining whether the multiplane read compatible read request is queued in the command queue of the memory device comprise determining whether another read request is queued in the command queue that is for a second portion of the die of the memory device.

18. The non-transitory machine-readable medium of claim 17, wherein the first portion is a first plane and the second portion is a second plane of the die.

19. The non-transitory machine-readable medium of claim 16, wherein the operations further comprise:
subsequent to causing execution of the first read command and the second read command in parallel:
receiving a third read command for a first portion of a die of the memory device;
determining whether a multiplane read compatible read request is queued in a command queue of the memory device;
responsive to a determination that the command queue does not contain the multiplane read compatible read request, queueing the third read command and restarting the timer;
determining that the timer expires prior to receiving another multiplane read compatible read request; and
responsive to determining that the timer expires prior to receiving another multiplane read compatible read request, causing execution of the third read command.

20. The non-transitory machine-readable medium of claim 16, wherein the operations of causing execution of the first read command and the second read command comprise combining the first read command and the second read command and sending the combined command to the memory die.

* * * * *